(12) United States Patent
Osanai et al.

(10) Patent No.: US 6,912,130 B2
(45) Date of Patent: Jun. 28, 2005

(54) COMBINED MEMBER OF ALUMINUM-CERAMICS

(75) Inventors: Hideyo Osanai, Tokyo (JP); Makoto Namioka, Tokyo (JP); Ken Iyoda, Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/669,550

(22) Filed: Sep. 24, 2003

(65) Prior Publication Data

US 2004/0062009 A1 Apr. 1, 2004

(30) Foreign Application Priority Data

Sep. 27, 2002 (JP) ........................................ 2002-283440

(51) Int. Cl.[7] .............................................. H05K 7/20
(52) U.S. Cl. .................... 361/699; 361/688; 361/689; 361/704; 361/707; 257/706; 257/714; 174/15.1; 174/16.3; 165/80.3; 165/80.4; 165/104.33; 165/185
(58) Field of Search ................................ 361/690, 699, 361/704–708, 717–719, 807–810; 165/80.3, 80.4, 185; 174/15.1, 16.3, 52.4; 428/545

(56) References Cited

U.S. PATENT DOCUMENTS 3,766,440 A  * 10/1973  Baird ........................ 361/708
4,497,875 A  *  2/1985  Arakawa et al. ............ 428/620
4,700,273 A  * 10/1987  Kaufman .................... 361/708
4,788,627 A  * 11/1988  Ehlert et al. ................ 361/717
5,533,257 A  *  7/1996  Romero et al. .......... 29/890.03
5,561,321 A  * 10/1996  Hirano et al. ............... 257/700
5,602,720 A  *  2/1997  Natsuhara et al. .......... 361/708
5,666,269 A  *  9/1997  Romero et al. ............. 361/699
6,016,007 A  *  1/2000  Sanger et al. ............... 257/714
6,033,787 A  *  3/2000  Nagase et al. .............. 428/545
6,245,442 B1 *  6/2001  Towata et al. .............. 428/614

FOREIGN PATENT DOCUMENTS

JP        02187058 A  *  7/1990   ......... H01L/23/373
JP        04363052 A     12/1992

* cited by examiner

Primary Examiner—Boris Chervinsky
(74) Attorney, Agent, or Firm—Patterson, Thuente, Skaar & Christensen, P.A.

(57) ABSTRACT

The present invention provides a combined member of aluminum-ceramics. The combined member comprises a ceramic board, a conductive member holding electronic parts thereon, formed on one surface of the ceramic board, and a water cooling jacket of aluminum or aluminum alloy bonded directly on the other surface of the ceramic board.

16 Claims, 4 Drawing Sheets

FIG. 4

COMBINED MEMBER OF ALUMINUM-CERAMICS

TECHNICAL FIELD

The present invention relates to a combined member of aluminum-ceramics, and more particularly, relates to a combined member of aluminum-ceramics having a heat radiating function, for use in electronic parts or power modules.

BACKGROUND ART

Hitherto, a semiconductor device comprising an insulating ceramic board, a metal circuit layer provided on one surface of the board, a heat radiating metal plate fixed on the other surface of the board, and semiconductor tips for controlling an electric voltage and current soldered on the metal circuit layer has been proposed. One or more semiconductor devices mentioned above are bonded with a soldering material on one surface of a metal base plate (heat sink) or on a composite member, and a heat releasing fin or fins are mounted through thermal conductive greases on the other surface of the metal base plate.

However, the above conventional semiconductor device has following problems. ① The bonding with a lead solder is used mainly, so that it is required to develop a new soldering material or soldering method in order to realize a lead free soldering method. ② The bonding with a lead solder is used mainly, so that there is a loss in heat transmission due to the lead in the soldering material. ③ The bonding with a lead solder is used mainly, so that there is a risk to reduce the yield rate of the manufacturing due to the voids of lead solder.

(4) The thermal conductivity of a thermal conductive grease is low remarkably. That is, the thermal conductivity of the thermal conductive grease on the market is several W/m·K at most.

The above problems (1) to (3) can be solved by using an insulating ceramic substrate bonded directly to a base plate. However, the problem (4) cannot be solved because no materials of higher thermal conductivity can be available on the market.

Japanese Patent Application Laid-Open No. 363052/92 discloses a semiconductor device, wherein heat radiating fins are directly bonded on a ceramic board by a brazing method. However, if the fin of aluminum large in coefficient of thermal expansion and volume is directly bonded on the thin ceramic board small in coefficient of thermal expansion, the ceramic board would be separated from the aluminum fin or the ceramic board would be damaged by the stress due to the difference in coefficient of thermal expansion between the fin and the ceramic board, when they are heated and cooled alternately and frequently and elevated in temperature as like as in the actual power module operation.

The task of the present invention is to solve the above problems and defects.

DISCLOSURE OF THE INVENTION

An object of the present invention is to provide a combined member of aluminum-ceramics characterized by comprising a ceramic board, a conductive member holding electronic parts thereon, formed on one surface of the ceramic board, and a heat radiating member of aluminum or aluminum alloy bonded directly on the other surface of the ceramic board.

In the direct bonding of the present invention, the heat radiating member of aluminum or aluminum alloy is bonded on the ceramic board directly without using any intermediate material, such as a brazing material.

The heat radiating member is larger in dimension than the ceramic board.

The heat radiating member has an wall enclosing the ceramic board.

The heat radiating member has a terminal base.

A further object of the present invention is to provide a combined member of aluminum-ceramics characterized by comprising a ceramic board, a conductive member holding electronic parts thereon, formed on one surface of the ceramic board, and a water cooling jacket of aluminum or aluminum alloy bonded directly on the other surface of the ceramic board.

The water cooling jacket contains copper.

The direct bonding is carried out by a molten bonding method.

The main component of the ceramic board is one of alumina, aluminum nitride and silicon nitride.

A plurality of ceramic board are used.

Another object of the present invention is to provide a power module characterized by comprising a combined member of aluminum-ceramics consisting of a ceramic board, a conductive member holding electronic parts thereon, formed on one surface of the ceramic board, and a heat radiating member of aluminum or aluminum alloy bonded directly on the other surface of the ceramic board.

The other object of the present invention is to provide a power module characterized by comprising a combined member of aluminum-ceramics consisting of a ceramic board, a conductive member holding electronic parts thereon, formed on one surface of the ceramic board and a water cooling jacket of aluminum or aluminum alloy bonded directly on the other surface of the ceramic board.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

BEST MODE FOR CARRYING OUT THE INVENTION

The present invention will now be explained with reference to the drawings.

(Embodiment 1)

Figure 1:
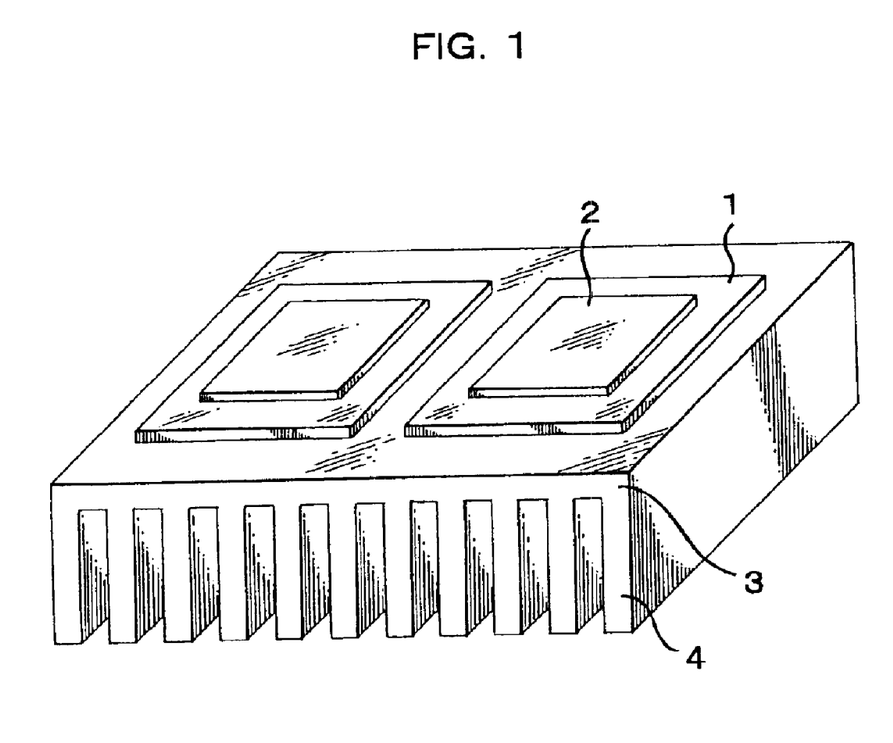
FIG. 1 is a perspective view of a combined member of aluminum-ceramics of a first embodiment according to the present invention.

FIG. 1 is a perspective view of a combined member of a first embodiment according to the present invention.

As shown in FIG. 1, two ceramic boards 1, each consisting of an alumina substrate of 0.25 mm in thickness and 40 mm×40 mm in size, were prepared.

The two ceramic boards 1 were separated by 10 cm from each other and set in a carbon mold (not shown), and then the carbon mold was inserted into a furnace. An atmosphere in the furnace was maintained with nitrogen gas and oxygen of not higher than 100 ppm. In the furnace, aluminum of 4N in purity was heated at 750° C. in order to obtain molten state of aluminum. An oxide film was removed from the molten aluminum, and the molten aluminum was poured into the mold by applying a pressure in the furnace by using a carbon cylinder. The mold was so designed when the molten aluminum was entered into the mold, as to form an aluminum plate 2 of 0.4 mm in thickness and 39 mm×39 mm in size on one surface (circuit layer side surface) of each of the ceramic boards 1, to form an aluminum base plate 3 of 5 mm in thickness and 110 mm×60 mm in size on the other surfaces of two ceramic boards 1, and to from a plurality of parallel aluminum fins 4 on the base plate 3, the fins 4 being spaced in a longitudinal direction by 5 mm with one another, extending from the base plate 3 in a direction opposite to the ceramic board 1 attached to the base plate 3, and each of the fins 4 having a height of 25 mm and a thickness of 5 mm. The mold was cooled so as to solidify the molten aluminum and connect to the ceramic boards 1. The mold was cooled at room temperature and the combined member thus obtained was removed from the mold. A circuit pattern was formed on one surface of the aluminum plate 2 by printing thereon an etching resist of a predetermined shape and etching by using a ferric chloride solution. A nickel layer of 3 $\mu$m in thickness was formed on the aluminum plate 2 by a nonelectrolytic nickel plating after removed the etching resist, so as to obtain a combined member comprising the aluminum plates 2 bonded directly on the ceramic boards 1 having the base plate 3 and the fins 4.

The combined member of the present invention was examined by the supersonic detector. No defect could be observed on a boundary face between the aluminum plate 2 and the ceramic board 1 and a boundary face between the base plate 3 and the ceramic board 1. Further, no crack was observed in the ceramic board 1. A thermal cycle test was performed to evaluate the examined combined member. The one thermal cycle was that the temperature of −40° C. was maintained for 30 minutes, 25° C. was maintained for 10 minutes, 125° C. was maintained for 30 minutes, and 25° C. was maintained for 10 minutes. After the thermal cycle of 3000 times, the boundary faces were examined again by the supersonic detector, but no change was recognized and no crack was recognized in the ceramic board 1.

(Embodiment 2)

A combined member was formed under the same condition as in the embodiment 1 except that aluminum nitride substrate of 0.635 mm in thickness was used as the ceramic board. The same effect as in the embodiment 1 was obtained.

(Embodiment 3)

A combined member was formed under the same condition as in the embodiment 1 except that silicon nitride substrate of 0.32 mm in thickness was used as the ceramic board. The same effect as in the embodiment 1 was obtained.

(Embodiment 4)

Two ceramic boards 1, each consisting of an alumina substrate of 0.25 mm in thickness and 40 mm×40 mm in size, were prepared. The two ceramic boards 1 were separated by 10 cm from each other and set in a carbon mold (not shown), and then the carbon mold was inserted into a furnace. An atmosphere in the furnace was maintained with nitrogen gas and oxygen of not higher than 100 ppm. In the furnace, aluminum of 4N in purity was heated at 750° C. in order to obtain molten state of aluminum. An oxide film was removed from the molten aluminum, and the molten aluminum was poured into the mold by applying a pressure in the furnace by using a carbon cylinder. The mold was so designed when the molten aluminum was entered into the mold, as to form an aluminum plate 2 of 0.4 mm in thickness and 39 mm×39 mm in size of 4N in purity on one surface (circuit layer side surface) of each of the ceramic boards 1, to from an aluminum base plate 3 of 5 mm in thickness and 110 mm×60 mm in size of 99.7% (JIS No. 1070) in purity on the other surfaces of two ceramic boards 1, and to form a plurality of parallel aluminum fins 4 on the base plate 3, the fins 4 being spaced in a longitudinal direction by 5 mm with one another, extending from the base plate 3 in a direction opposite to the ceramic board 1 attached to the base plate 3, and each of the fins 4 having a height of 25 mm and a thickness of 5 mm. The mold was cooled so as to solidify the molten aluminum and connect to the ceramic boards 1. The mold was cooled at room temperature and the combined member thus obtained was removed from the mold. A circuit pattern was formed on one surface of the aluminum plate 2 by printing thereon an etching resist of a predetermined shape and etching by using a ferric chloride solution. A nickel layer of 3 $\mu$m in thickness was formed on the aluminum plate 2 by a nonelectrolytic nickel plating after removed the etching resist, so as to obtain a combined member comprising the aluminum plates 2 bonded directly on the ceramic boards 1 having the base plate 3 and the fins 4.

The combined member of the present invention was examined by the supersonic detector. No defect could be observed on a boundary face between the aluminum plate 2 and the ceramic board 1 and a boundary face between the base plate 3 and the ceramic board 1. Further, no crack was observed in the ceramic board 1. A thermal cycle test was performed to evaluate the examined combined member. The one thermal cycle was that the temperature of −40° C. was maintained for 30 minutes, 25° C. was maintained for 10 minutes, 125° C. was maintained for 30 minutes, and 25° C. was maintained for 10 minutes. After the thermal cycle of 3000 times, the boundary faces were examined again by the supersonic detector, but no change was recognized and no crack was recognized in the ceramic board 1.

(Embodiment 5)

A combined member was formed under the same condition as in the embodiment 4 except that aluminum nitride substrate of 0.635 mm in thickness was used as the ceramic board. The same effect as in the embodiment 4 was obtained.

(Embodiment 6)

A combined member was formed under the same condition as in the embodiment 4 except that silicon nitride substrate of 0.32 mm in thickness was used as the ceramic board. The same effect as in the embodiment 4 was obtained.

(Embodiment 7)

Two ceramic boards 1, each consisting of an alumina substrate of 0.25 mm in thickness and 40 mm×40 mm in size, were prepared. The two ceramic boards 1 were separated by 10 cm from each other and set on a carbon mold (not shown), and then the carbon mold was inserted into a furnace. An atmosphere in the furnace was maintained with nitrogen gas and oxygen of not higher than 100 ppm. In the furnace, aluminum of 99. 7% (JIS No. 1070) in purity was heated at 750° C. in order to obtain molten state of aluminum. An oxide film was removed from the molten aluminum, and the molten aluminum was poured into the mold by applying a pressure in the furnace by using carbon cylinder. The mold was so designed when the molten aluminum was poured into the mold, as to form an aluminum plate 2 of 0.4 mm in thickness and 39 mm×39 mm in size on one surface (circuit layer side surface) of each of the ceramic boards 1, to from an aluminum base plate 3 of 5 mm in thickness and 110 mm×60 mm in size on the other surfaces of two ceramic boards 1, and to form a plurality of parallel aluminum fins 4 on the base plate 3, the fins 4 being spaced in a longitudinal direction by 5 mm with one another, extending from the base plate 3 in a direction opposite to the ceramic board 1 attached to the base plate 3, and each of the fins 4 having a height of 25 mm and a thickness of 5 mm. The mold was cooled so as to solidify the molten aluminum and connect to the ceramic boards 1. The mold was cooled at room temperature and the combined member thus obtained was removed from the mold. A circuit pattern was formed on one surface of the aluminum plate 2 by printing thereon an etching resist of a predetermined shape and etching by using a ferric chloride solution. A nickel layer of 3 µm in thickness was formed on the aluminum by a nonelectrolytic nickel plating after removing the etching resist, so as to obtain a combined member comprising the aluminum plates 2 bonded directly on the ceramic boards 1 having the base plate 3 and the fins 4.

The combined member of the present invention was examined by the supersonic detector. No defect could be observed on a boundary face between the aluminum plate 2 and the ceramic board 1 and a boundary face between the base plate 3 and the ceramic board 1. Further, no crack was observed in the ceramic board 1. A thermal cycle test was performed to evaluate the examined combined member. The one thermal cycle was that the temperature of −40° C. was maintained for 30 minutes, 25° C. was maintained for 10 minutes, 125° C. was maintained for 30 minutes, and 25° C. was maintained for 10 minutes.

After the thermal cycle of 3000 times, the boundary faces were examined again by the supersonic detector, but no change was recognized and no crack was recognized in the ceramic board 1.

(Embodiment 8)

A combined member was formed under the same condition as in the embodiment 7 except that aluminum nitride substrate of 0.635 mm in thickness was used as the ceramic board. The same effect as in the embodiment 7 was obtained.

(Embodiment 9)

A combined member was formed under the same condition as in the embodiment 7 except that silicon nitride substrate of 0.32 mm in thickness was used as the ceramic board. The same effect as in the embodiment 7 was obtained.

(Embodiment 10)

Two ceramic boards 1, each consisting of an alumina substrate of 0.25 mm in thickness and 40 mm×40 mm in size, were prepared. The two ceramic boards 1 were separated by 10 cm from each other and set on a carbon mold (not shown) and then the carbon mold was inserted into a furnace. An atmosphere in the furnace was maintained with a nitrogen gas and oxygen of not higher than 100 ppm. In the furnace, aluminum of 99.5% by weight and copper of 0.5% by weight were heated at 750° C. in order to obtain molten state of them. An oxide film was removed from the molten aluminum alloy, and the molten aluminum alloy was poured into the mold by applying a pressure in the furnace by using a carbon cylinder. The copper was added under the consideration of the corrosion of the aluminum. The mold was so designed when the molten aluminum alloy was poured into the mold, as to form an aluminum plate 2 of 0.4 mm in thickness and 39 mm×39 mm in size on one surface (circuit layer side surface) of each of the ceramic boards 1, to from a base plate 3 of 5 mm in thickness and 110 mm×60 mm in size on the other surfaces of two ceramic boards 1, and to from a plurality of parallel aluminum fins 4 on the base plate 3, the fins 4 being spaced in a longitudinal direction by 5 mm with one another, extending from the base plate 3 in a direction opposite to the ceramic board 1 attached to the base plate 3, and each of the fins 4 having a height of 25 mm and a thickness of 5 mm. The mold was cooled so as to solidify the molten aluminum alloy and connect to the ceramic boards 1. The mold was cooled at room temperature and the combined member thus obtained was removed from the mold. A circuit pattern was formed on one surface of the aluminum plate 2 by printing thereon an etching resist of a predetermined shape and etching by using a ferric chloride solution. A nickel layer of 3 µm in thickness was formed on the aluminum by a nonelectrolytic nickel plating after removed the etching resist, so as to obtain a combined member comprising the aluminum plates 2 bonded directly on the ceramic boards 1 having the cooling plate 3 and the fins 4.

The combined member of the present invention was examined by the supersonic detector. No defect could be observed on a boundary face between the aluminum plate 2 and the ceramic board 1 and a boundary face between the base plate 3 and the ceramic board 1. Further, no crack was observed in the ceramic board 1. A thermal cycle test was performed to evaluate the examined combined member. The one thermal cycle was that the temperature of −40° C. was maintained for 30 minutes, 25° C. was maintained for 10 minutes, 125° C. was maintained for 30 minutes, and 25° C. was maintained for 10 minutes. After the thermal cycle of 3000 times, the boundary faces were examined again by the supersonic detector, but no change was recognized and no crack was recognized in the ceramic board 1.

(Embodiment 11)

A combined member was formed under the same condition as in the embodiment 10 except that aluminum nitride substrate of 0.635 mm in thickness was used as the ceramic board. The same effect as in the embodiment 10 was obtained.

(Embodiment 12)

A combined member was formed under the same condition as in the embodiment 10 except that silicon nitride substrate of 0.32 mm in thickness was used as the ceramic board. The same effect as in the embodiment 10 was obtained.

(Embodiment 13)

Figure 2:
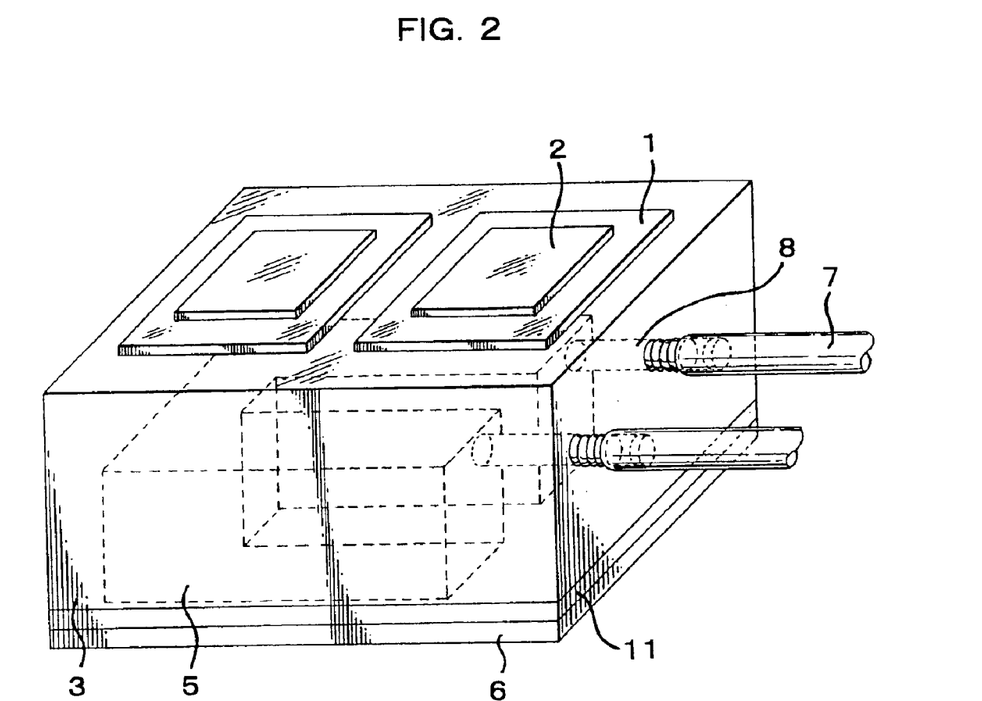
FIG. 2 is a perspective view of a combined member of aluminum-ceramics of a second embodiment according to the present invention.

As shown in FIG. 2, two ceramic boards 1, each consisting of an alumina substrate of 0.25 mm in thickness and 40 mm×40 mm in size, were prepared. The two ceramic boards 1 were separated by 10 cm from each other and set on a carbon mold (not shown), and then the carbon mold was inserted into a furnace. An atmosphere in the furnace was maintained with a nitrogen atmosphere gas and oxygen of not higher than 100 ppm. In the furnace, aluminum of 99.5% by weight and copper of 0.5% by weight were heated at 750° C. in order to obtain molten state of them. An oxide film removed from the molten aluminum alloy, and the molten aluminum alloy was poured into the mold by applying a pressure in the furnace by using a carbon cylinder. The copper was added under the consideration of the corrosion of the aluminum. The mold was so designed when the molten aluminum alloy was poured into the mold, as to form an aluminum plate 2 of 0.4 mm in thickness and 39 mm×39 mm in size on one surface (circuit layer side surface) of each of the ceramic boards 1, to form a base plate 3 of 50 mm in thickness and 110 mm×60 mm in size on the other surfaces of ceramic boards 1, and t form a snaky water cooling jacket 5 in the base plate 3. The mold was cooled so as to solidify the molten aluminum alloy and connect to the ceramic boards 1. The mold was cooled at room temperature and the combined member thus obtained was removed from the mold. A circuit pattern was formed on one surface of the aluminum plate 2 by printing thereon an etching resist of a predetermined shape and etching by using a ferric chloride solution. A nickel layer of 3 $\mu$m in thickness was formed on the aluminum by a nonelectrolytic nickel plating after removing the etching resist, so as to obtain a combined member comprising the aluminum plates 2 bonded directly on the ceramic boards 1 having the base plate 3.

The bottom surface of the base plate 3 was closed by an aluminum plate 6 through rubber seal 11. The aluminum plate 6 and the rubber seal 11 were fixed by an adhesive agent. However, screws or spot welding might be considered. A rubber pipe 7 was connected to the water cooling jacket 5 passing through an opening formed on the side surface of the base plate 3.

The combined member of the present invention was examined by the supersonic detector. No defect could be observed on a boundary face between the aluminum plate 2 and the ceramic board 1 and a boundary face between the base plate 3 and the ceramic boards 1. Further, no crack was observed in the ceramic board 1. A thermal cycle test was performed to evaluate the examined combined member. The one thermal cycle was that the temperature of −40° C. was maintained for 30 minutes, 25° C. was maintained for 10 minutes, 125° C. was maintained for 30 minutes, and 25° C. was maintained for 10 minutes. After the thermal cycle of 3000 times, the boundary faces were examined again by the supersonic detector, but no changes was recognized and no crack was recognized in the ceramic board 1.

(Embodiment 14)

A combined member was formed under the same condition as in the embodiment 13 except that aluminum nitride substrate of 0.635 mm in thickness was used as the ceramic board. The same effect as in the embodiment 13 was obtained.

(Embodiment 15)

A combined member was formed under the same condition as in the embodiment 13 except that silicon nitride substrate of 0.32 mm in thickness was used as the ceramic board. The same effect as in the embodiment 13 was obtained.

(Embodiment 16)

Figure 3:
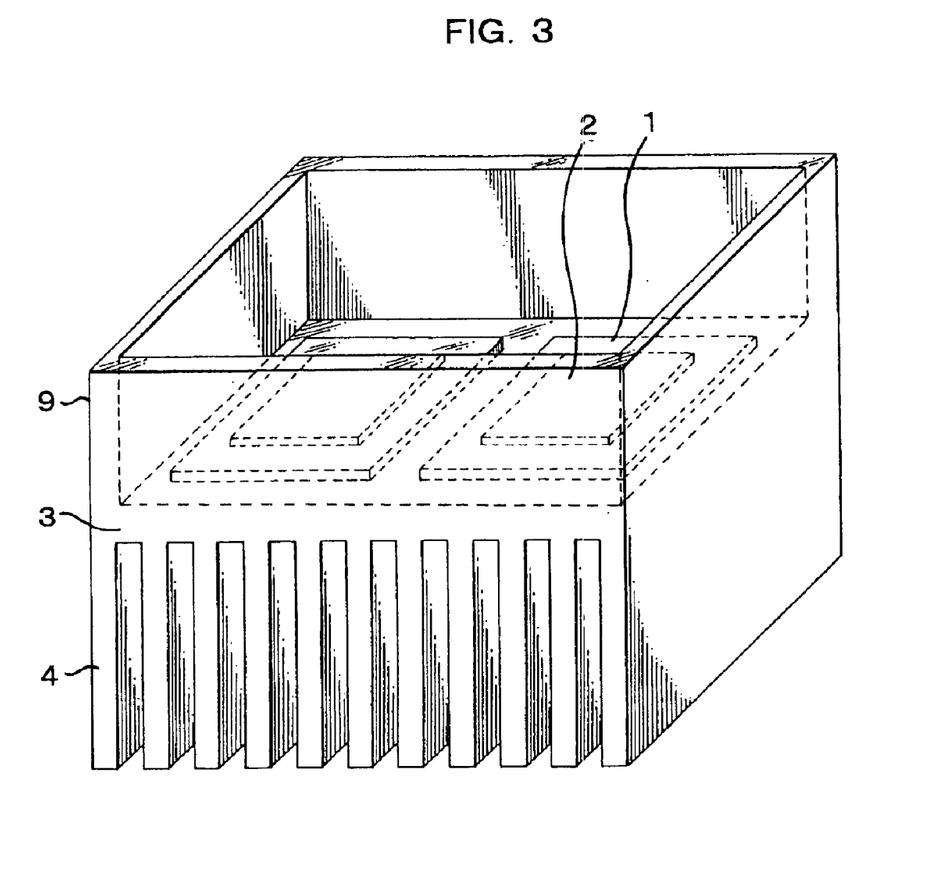
FIG. 3 is a perspective view of a combined member of aluminum-ceramics of a third embodiment according to the present invention.

As shown in FIG. 3, two ceramic boards 1, each consisting of an alumina substrate of 0.25 mm in thickness and 40 mm×40 mm in size, were prepared. The two ceramic boards 1 were separated by 10 cm from each other and set on a carbon mold (not shown) and then the carbon mold was inserted into a furnace. An atmosphere in the furnace was maintained with a nitrogen gas and oxygen of not higher than 100 ppm. In the furnace, aluminum of 99.5% by weight and copper of 0.5% by weight were heated at 750° C. in order to obtain molten state of them. An oxide film was removed from the molten aluminum alloy, and the molten aluminum alloy was purged into the mold by applying a pressure in the furnace by the using a carbon cylinder. The mold was so designed when the molten aluminum alloy was poured into the mold, as to form an aluminum plate 2 of 0.4 mm in thickness and 39 mm×39 mm in size on one surface (circuit layer side surface) of each of the ceramic boards 1, to form a base plate 3 of 5 mm in thickness and 110 mm×60 mm in size on the other surfaces of two ceramic boards 1, to form a vertically extending wall 9 of 5 mm in thickness and 25 mm in height on an edge of one surface of the base plate 3, on which surface the ceramic boards 1 were mounted, and to form a plurality of aluminum fins 4 on the other surface of the base plate 3, the fins 4 being spaced in a longitudinal direction by 5 mm with one another, extending from the base plate 3 in a direction opposite to the ceramic board 1 attached to the base plate 3, and each of the fins 4 having a height of 25 mm and a thickness of 5 mm. The mold was cooled so as to solidify the molten aluminum alloy and connect to the ceramic boards 1. The mold was cooled at room temperature and the combined member thus obtained was removed from the mold. A circuit pattern was formed on one surface of the aluminum plate 2 by printing thereon an etching resist of a predetermined shape and etching by using a ferric chloride solution. A nickel layer of 3 $\mu$m in thickness was formed on the aluminum by a nonelectrolytic nickel plating after removing the etching resist, so as to obtain a combined member comprising the aluminum plates 2 bonded directly on the ceramic boards 1 having the base plate 3 and the fins 4.

The combined member of the present invention was examined by the supersonic detector. No defect could be observed on a boundary face between the aluminum plate 2 and the ceramic board 1 and a boundary face between the cooling pate 3 and the ceramic board 1. Further, no crack was observed in the ceramic board 1. A thermal cycle test was performed to evaluate the examined combined member. The one thermal cycle was that the temperature of −40° C. was maintained for 30 minutes, 25° C. was maintained for 10 minutes, 125° C. was maintained for 30 minutes, and 25° C. was maintained for 10 minutes. After the thermal cycle of 3000 times, the boundary faces were examined again by the supersonic detector, but no changes was recognized, and no crack was recognized in the ceramic board 1.

(Embodiment 17)

A combined member was formed under the same condition as in the embodiment 16 except that aluminum nitride substrate of 0.635 mm in thickness was used as the ceramic board. The same effect as in the embodiment 16 was obtained.

(Embodiment 18)

A combined member was formed under the same condition as in the embodiment 16 except that silicon nitride substrate of 0.32 mm in thickness was used as the ceramic board. The same effect as in the embodiment 16 was obtained.

(Embodiment 19)

Figure 4:
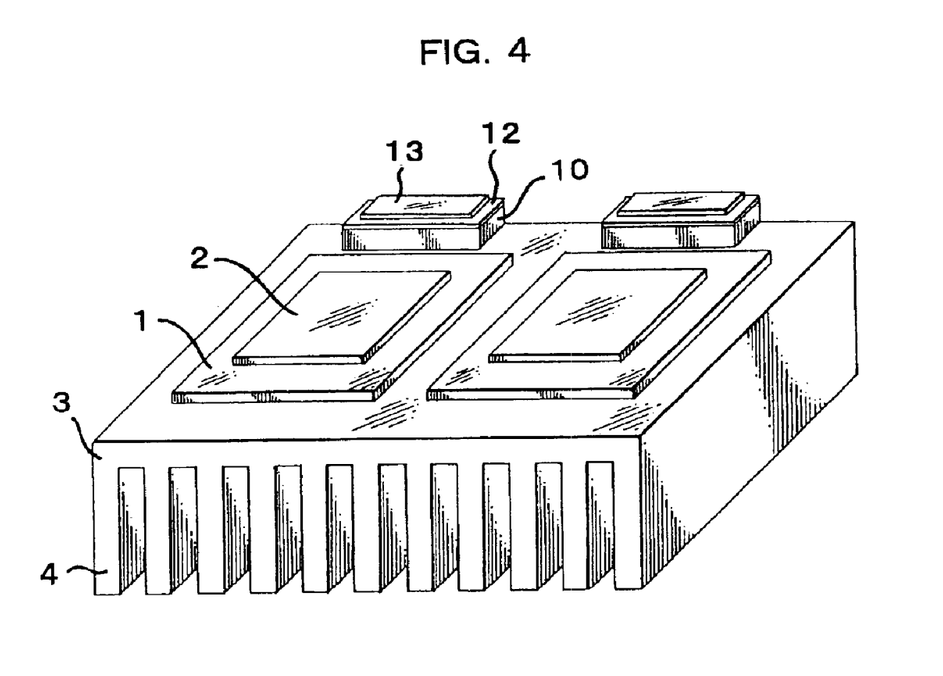
FIG. 4 is a perspective view of a combined member of aluminum-ceramics of a fourth embodiment according to the present invention.

As shown in FIG. 4, two ceramic boards 1, each consisting of an alumina substrate of 0.25 mm in thickness and 40 mm×40 mm in size, were prepared. The two ceramic boards 1 were separated by 10 cm from each other and set on a carbon mold (not shown).

Two alumina layers 12 of 0.635 in thickness and 10 mm×20 mm in size were prepared and set in the mold.

Then the carbon mold was inserted into a furnace. An atmosphere in the furnace was maintained with a nitrogen gas and oxygen of not higher than 100 ppm. In the furnace, aluminum of 99.5% by weight and copper of 0.5% by weight were heated at 750° C. in order to obtain molten state of them. An oxide film was removed from molten aluminum alloy, and the molten aluminum alloy was poured into the mold by applying a pressure in the furnace by using a carbon cylinder. The mold was so designed when the molten aluminum alloy was poured into the mold, as to form an aluminum plate 2 of 0.4 mm in thickness and 39 mm×39 mm in size on one surface (circuit layer side surface) of each of the ceramic boards 1, to form a base plate 3 of 5 mm in thickness and 110 mm×60 mm in size on the other surfaces of two ceramic boards 1, to form two terminal bases 10 of 3 mm in height and 10 mm×20 mm in size between one surface of the base plate 3, on which surface the ceramic boards 1 were mounted, and the alumna layers 12, to form an aluminum layer 13 of 0.4 mm in thickness and 9 mm×19 mm in size on each of the alumina layers 12, and to form a plurality of parallel aluminum fins 4 on the base plate 3, the fins 4 being spaced in a longitudinal direction by 5 mm with one another, extending from the base plate 3 in a direction opposite to the ceramic board 1 attached to the base plate 3, and each of the fins 4 having a height of 25 mm and a thickness of 5 mm. The mold was cooled so as to solidify the molten aluminum alloy and connect to the ceramic boards 1. The mold was cooled at room temperature and the combined member thus obtained was removed from the mold. A circuit pattern was formed on one surface of the aluminum plate 2 by printing thereon an etching resist of a predetermined shape and etching by using a ferric chloride solution. A nickel layer of 3 μm in thickness was formed on the aluminum by a nonelectrolytic nickel plating after removed the etching resist, so as to obtain a combined member comprising the aluminum plates 2 bonded directly on the ceramic boards 1 having the cooling plate 3 and the fins 4.

An aluminum wire for connecting electronic parts with terminals on the terminal base 10 will be formed by a supersonic bonding. The alumina layer 12 on the one surface of the aluminum plate 3 is higher by the height of the terminal base 10 than the ceramic board 1 on the one surface of the aluminum plate 3.

The combined member of the present invention was examined by the supersonic detector. No defect could be observed on a boundary face between the aluminum plate 2 and the ceramic board 1 and a boundary face between the base plate 3 and the ceramic board 1. Further, no crack was observed in the ceramic board 1. A thermal cycle test was performed to evaluate the examined combined member. The one thermal cycle was that the temperature of −40° C. was maintained for 30 minutes, 25° C. was maintained for 10 minutes, 125° C. was maintained for 30 minutes, and 25° C. was maintained for 10 minutes.

After the thermal cycle of 3000 times, the boundary faces were examined again by the supersonic detector, but no changes was recognized and no crack was recognized in the ceramic board 1.

(Embodiment 20)

A combined member was formed under the same condition as in the embodiment 19 except that aluminum nitride substrate of 0.635 mm in thickness was used as the ceramic board. The same effect as in the embodiment 19 was obtained.

(Embodiment 21)

A combined member was formed under the same condition as in the embodiment 19 except that silicon nitride substrate of 0.32 mm in thickness was used as the ceramic board. The same effect as in the embodiment 19 was obtained.

COMPARATIVE EXAMPLE 1

A base plate with fins was prepared for comparison. The base plate was made by cutting a plate of aluminum of 99.7% (JIS No. 1070) in purity of 30 mm in thickness and 110 mm×60 mm in size by using a milling machine so as to form on one surface thereof a plurality of parallel fins of 25 mm in height and 5 mm in thickness, spaced in a longitudinal direction by 5 mm with one another. Two alumina substrates of 0.25 mm in thickness and 40 mm×40 mm in size were prepared as ceramic plates. Two aluminum plates of 4 N in purity of 0.4 mm in thickness and 39 mm×39 mm in size were prepared. A foil of 20 μm in thickness of brazing alloy consisting of aluminum of 95% by weight, copper of 4% by weight and magnesium of 1% by weight was prepared. Each of the aluminum plates of 0.4 mm in thickness was attached through the foil of 20 μm in thickness to one surface of each of the ceramic plates. The other surfaces of the ceramic plates were attached through the foils of 20 μm in thickness to the aluminum base plate with fins, the two ceramic plates being separated by 10 mm from each other. The aluminum plates, the ceramic plates and the base plate were connected together in the vacuum of $10^{-4}$ Torr at 630° C. while applying a pressure of 20 Kgf/cm². After combined, a circuit pattern was formed on one surface of each of the aluminum plates of 0.4 mm in thickness by printing thereon an etching resist of a predetermined shape and etching by using a ferric chloride solution. A nickel layer of 3 μm in thickness was formed on the aluminum plate by a nonelectrolytic nickel plating after removed the etching resist, so as to obtain a combined member comprising the two aluminum plates bonded directly on the ceramic plates.

The combined member for the comparison was examined by the supersonic detector. No defect could be observed on a boundary face between the aluminum plate and the ceramic plate and a boundary face between the base plate and the ceramic plate. Further, no crack was observed in the ceramic plate. A thermal cycle test was performed to evaluate the examined combined member.

The one thermal cycle was that the temperature of −40° C. was maintained for 30 minutes, 25° C. was maintained for 10 minutes, 125° C. was maintained for 30 minutes, and 25° C. was maintained for 10 minutes. After the thermal cycle of 3000 times, the boundary faces were examined again by the supersonic detector, but no crack was recognized in the ceramic plate.

However, a peeling of about 10 mm was recognized at the boundary face between the ceramic plate and the base plate, but no crack was recognized in the ceramic plate.

COMPARATIVE EXAMPLE 2

A combined member was formed under the same condition as in the comparative example 1 except that aluminum nitride substrate of 0.635 mm in thickness was used as the ceramic plate. The same effect as in the comparative example 1 was obtained.

COMPARATIVE EXAMPLE 3

A combined member was formed under the same condition as in the comparative example 1 except that silicon nitride substrate of 0.32 mm in thickness was used as the ceramic plate. The same effect as in the comparative example 1 was obtained.

COMPARATIVE EXAMPLE 4

A base plate with fins was prepared for comparison. The base plate was made by cutting a plate of aluminum of 4 N in purity of 30 mm in thickness and 110 mm×60 mm in size by using a milling machine so as to form on one surface thereof a plurality of parallel fins of 25 mm in height and 5 mm in thickness, spaced in a longitudinal direction by 5 mm with one another. Two alumina substrates of 0.25 mm in thickness and 40 mm×40 mm in size were prepared as ceramic plates. Two aluminum plates of 4 N in purity of 0.4 mm in thickness and 39 mm×39 mm in size were prepared. A foil of 20 μm in thickness of brazing alloy consisting of aluminum of 95% by weight, copper of 4% by weight and magnesium of 1% by weight was prepared. Each of the aluminum plates of 0.4 mm in thickness was attached through the foil of 20 μm in thickness to one surface of each of the ceramic plates. The other surfaces of the ceramic plates were attached through the foil of 20 μm in thickness to the aluminum base plate with fins, the two ceramic plates being separated by 10 mm from each other. The aluminum plates, the ceramic plates and the base plate were connected together in the vacuum of $10^{-4}$ Torr at 630° C. while applying a pressure of 20 Kgf/cm². After combined, a circuit pattern was formed on one surface of each of the aluminum plate of 0.4 mm in thickness by printing thereon an etching resist of a predetermined shape and etching by using a ferric chloride solution. A nickel layer of 3 μm in thickness was formed on the aluminum plate by a nonelectrolytic nickel plating, after removed the etching resist, so as to obtain a combined member comprising the two aluminum plates bonded directly on the ceramic boards.

The combined member for the comparison was examined by the supersonic detector. No defect could be observed on a boundary face between the aluminum plate and the ceramic plate and a boundary face between the base plate and the ceramic plate. Further, no crack was observed in the ceramic plate. A thermal cycle test was performed to evaluate the examined combined member.

The one thermal cycle was that the temperature of −40° C. was maintained for 30 minutes, 25° C. was maintained for 10 minutes, 125° C. was maintained for 30 minutes, and 25° C. was maintained for 10 minutes. After the thermal cycle of 3000 times, the boundary faces were examined again by the supersonic detector, but no crack was recognized in the ceramic plate. However, a peeling of about 10 mm was recognized at the boundary face between the ceramic plate and the base plate, but no crack was recognized in the ceramic plate.

COMPARATIVE EXAMPLE 5

A combined member was formed under the same condition as in the comparative example 4 except that aluminum nitride substrate of 0.635 mm in thickness was used as the ceramic plate. The same effect as in the comparative example 4 was obtained.

COMPARATIVE EXAMPLE 6

A combined member was formed under the same condition as in the comparative example 4 except that silicon nitride substrate of 0.32 mm in thickness was used as the ceramic plate. The same effect as in the comparative example 4 was obtained.

Table 1 shows the above results.

TABLE 1

| | Aluminum of circuit side | | | | Aluminum of base side | | | Evaluation (After H/C3000 times) | |
|---|---|---|---|---|---|---|---|---|---|
| | Quality | thickness | Ceramics Quality | thickness | Quality | thickness | figure | boundary surface | ceramics crack |
| Embodiment 1 | 4N | 0.4 mm | alumina | 0.25 mm | 4N | 30 mm | with fin | no change | no crack |
| Embodiment 2 | 4N | 0.4 mm | aluminum nitride | 0.635 mm | 4N | 30 mm | with fin | no change | no crack |
| Embodiment 3 | 4N | 0.4 mm | silicon nitride | 0.32 mm | 4N | 30 mm | with fin | no change | no crack |
| Embodiment 4 | 4N | 0.4 mm | alumina | 0.25 mm | 99.7% | 30 mm | with fin | no change | no crack |
| Embodiment 5 | 4N | 0.4 mm | aluminum nitride | 0.635 mm | 99.7% | 30 mm | with fin | no change | no crack |
| Embodiment 6 | 4N | 0.4 mm | silicon nitride | 0.32 mm | 99.7% | 30 mm | with fin | no change | no crack |
| Embodiment 7 | 99.7% | 0.4 mm | alumina | 0.25 mm | 99.7% | 30 mm | with fin | no change | no crack |
| Embodiment 8 | 99.7% | 0.4 mm | aluminum nitride | 0.635 mm | 99.7% | 30 mm | with fin | no change | no crack |
| Embodiment 9 | 99.7% | 0.4 mm | silicon nitride | 0.32 mm | 99.7% | 30 mm | with fin | no change | no crack |
| Embodiment 10 | 99.5% Al + 0.5% Cu | 0.4 mm | alumina | 0.25 mm | 99.5% Al + 0.5% Cu | 30 mm | with fin | no change | no crack |
| Embodiment 11 | 99.5% Al + 0.5% Cu | 0.4 mm | aluminum nitride | 0.635 mm | 99.5% Al + 0.5% Cu | 30 mm | with fin | no change | no crack |
| Embodiment 12 | 99.5% Al + 0.5% Cu | 0.4 mm | silicon nitride | 0.32 mm | 99.5% Al + 0.5% Cu | 30 mm | with fin | no change | no crack |
| Embodiment 13 | 99.5% Al + 0.5% Cu | 0.4 mm | alumina | 0.25 mm | 99.5% Al + 0.5% Cu | 30 mm | with water jacket | no change | no crack |
| Embodiment 14 | 99.5% Al + 0.5% Cu | 0.4 mm | aluminum nitride | 0.635 mm | 99.5% Al + 0.5% Cu | 30 mm | with water jacket | no change | no crack |
| Embodiment 15 | 99.5% Al + 0.5% Cu | 0.4 mm | silicon nitride | 0.32 mm | 99.5% Al + 0.5% Cu | 30 mm | with water jacket | no change | no crack |
| Embodiment 16 | 99.5% Al + 0.5% Cu | 0.4 mm | alumina | 0.25 mm | 99.5% Al + 0.5% Cu | 30 mm | with wall | no change | no crack |
| Embodiment 17 | 99.5% Al + 0.5% Cu | 0.4 mm | aluminum nitride | 0.635 mm | 99.5% Al + 0.5% Cu | 30 mm | with wall | no change | no crack |
| Embodiment 18 | 99.5% Al + 0.5% Cu | 0.4 mm | silicon nitride | 0.32 mm | 99.5% Al + 0.5% Cu | 30 mm | with wall | no change | no crack |

TABLE 1-continued

| | Aluminum of circuit side | | | | Aluminum of base side | | | Evaluation (After H/C3000 times) | |
|---|---|---|---|---|---|---|---|---|---|
| | | thick- | Ceramics | | | thick- | | boundary | ceramics |
| | Quality | ness | Quality | thickness | Quality | ness | figure | surface | crack |
| Embodiment 19 | 99.5% Al + 0.5% Cu | 0.4 mm | alumina | 0.25 mm | 99.5% Al + 0.5% Cu | 30 mm | with terminal base | no change | no crack |
| Embodiment 20 | 99.5% Al + 0.5% Cu | 0.4 mm | aluminum nitride | 0.635 mm | 99.5% Al + 0.5% Cu | 30 mm | with terminal base | no change | no crack |
| Embodiment 21 | 99.5% Al + 0.5% Cu | 0.4 mm | silicon nitride | 0.32 mm | 99.5% Al + 0.5% Cu | 30 mm | with terminal base | no change | no crack |
| Comparative example 1 | 4N | 0.4 mm | alumina | 0.25 mm | 99.7% | 30 mm | with fin | peeling | no crack |
| Comparative example 2 | 4N | 0.4 mm | aluminum nitride | 0.635 mm | 99.7% | 30 mm | with fin | peeling | no crack |
| Comparative example 3 | 4N | 0.4 mm | silicon nitride | 0.32 mm | 99.7% | 30 mm | with fin | peeling | no crack |
| Comparative example 4 | 4N | 0.4 mm | alumina | 0.25 mm | 4N | 30 mm | with fin | peeling | no crack |
| Comparative example 5 | 4N | 0.4 mm | aluminum nitride | 0.635 mm | 4N | 30 mm | with fin | peeling | no crack |
| Comparative example 6 | 4N | 0.4 mm | silicon nitride | 0.32 mm | 4N | 30 mm | with fin | peeling | no crack |

According to the present invention, lead solder is not used for connecting the ceramic circuit board with the metal base plate or the composite member on the contrary to the conventional manner, so that the good life-environment can be realized, the loss of heat transmission and the deterioration of the heat radiation can be reduced. Further, there is no risk to reduce the yield rate of the manufacturing due to the voids of lead solder. The assembling step wherein the metal base plate or the composite member is soldered can be omitted. Further, it is not necessary to use the thermal conductive grease for connecting the ceramic circuit board with the heats radiating fins, so that the deterioration of the heat transmission can be prevented.

The problems due to the use of the lead solder can be solved by connecting the ceramic substrate, such as aluminum nitride to the aluminum circuit plate and the heat radiating fins with the brazing material of aluminum series. However, they are heated and cooled alternately and frequently, when they are used as the power module and installed in the vehicles, such as automobiles and electric cars, so that the peeling may be generated at the boundary face between the ceramic board and the aluminum plate or the ceramic board may be damaged due to the difference in coefficient of thermal expansion between the ceramics and the aluminum plate, and due to the use of the brazing material. The thickness of the brazing material actually used is up to several hundreds μm and very small compared with the thickness of the heat radiating plate or fin of several mm.

However, the brazing material layer is brittle, and the 0.2 offset yield stress of deformation and thus the thermal stress to be generated are large, so that the brazing material layer at the boundary face or the ceramic board itself is damaged.

In the present invention, the brazing material is not used, the ceramic board is bonded directly to the aluminum pate, and the plastic deformation of the bonded metal is utilized, so that a stress concentrated to the boundary face can be reduced. According to the present invention, the thermal cycle resistance can be increased remarkably compared with that in case of use of the brazing material. That is, according to the present invention, a combined member of aluminum-ceramics of high reliability, usable in the vehicles can be obtained. In the combined member of the present invention, any change is not recognized at the boundary face of the aluminum pate and the ceramic board, and any crack is not formed in the ceramic board, after the thermal cycle test of 3000 times. In one thermal cycle, the temperature was changed from room temperature to −40° C. and maintained for 30 minutes, changed to room temperature and maintained for 10 minutes, changed to 125° C. and maintained for 30 minutes, and changed to room temperature and maintained for 10 minutes.

As a method for bonding directly the ceramic board with the aluminum plate, a molten metal bonding method, a direct bonding method, wherein, the aluminum plate is positioned on the ceramic plate and heated them in an inert gas, such as nitrogen gas or an eutectic bonding method of Al—Si etc. can be considered.

In the molten metal bonding method, molten aluminum is poured into a mold holding a ceramic board at a predetermined position, so that the molten aluminum is solidified and bonded on the ceramic board. This molten metal bonding method is characterized in that a fin of various figure can be formed easily by selecting the design of the mold. The other method is characterized in that an aluminum member having fins of a predetermined figure made preliminarily by machining or forging etc. is bonded to a ceramic board in an atmosphere of nitrogen gas or vacuum. The figure of the fins is determined by the heat quantity of the elements installed on the circuit plate. Normally, the fins of several cm in height and several mm in thickness, separated by several mm from one another, as shown in FIG. 1 can be formed easily by the machining or forging.

The aluminum member is made larger in dimension than the ceramic board, so that a portion of the aluminum member projected from the ceramic board can be utilized for the bonding portion of the plastic package etc., which is used in the power module manufacturing steps. Further, by the projected portion, a compression stress is applied to the fin of the aluminum member when it is cooled, so that the thermal cycle resistance is increased. The above projected portion can also be utilized as a reference surface for the assembling steps of the module, such as soldering, wire bonding and packaging etc.

In case that a wall for enclosing the ceramic board is formed on the heat radiating member, the wall can be utilized as a container for the insulation gel in place of the plastic package in the manufacturing of the power module, and directly as a structure of module.

In case that a terminal base is formed on the heat radiating member, a step for forming a combined member of metal-ceramic board on the power module using the conventional soldering method can be omitted. In case that the heat radiating member is formed of aluminum including copper, the resistance property to the corrosion can be enhanced.

The combined member of aluminum-ceramics according to the present invention comprises a ceramic board, a conductive member for holding electronic parts thereon, formed on one surface of the ceramic board, and a water cooling jacket of aluminum or aluminum alloy bonded directly on the other surface of the ceramic board.

In this combined member, more stable cooling ability can be obtained by the water cooling jacket. It is preferable under the consideration of corrosion to add copper in the aluminum or aluminum alloy forming the water cooling jacket. It is preferable to use a molten metal bonding method as the direct bonding method in points of the adaptability of the configuration of the combined member and the reliability of the bonding.

As the ceramic board, it is preferable to use aluminum nitride in point of the heat transmission, to use silicon nitride in point of the strength, and to use alumina in point of the cost. It may be possible to use a plurality of ceramic boards in point of the circuit design.

By using the combined member of aluminum-ceramics of the present invention, a power module having a high heat radiating ability, a high thermal cycle resistance, and low assembly cost can be realized.

As state above, the combined member according to the present invention, the bonding force of the aluminum plate with the ceramic board is stronger than that using the brazing method and the defect in bonding is hardly generated. In the conventional combined member formed by using the brazing method, the aluminum fin is made by forging or machining an aluminum body and bonding to the ceramic board with a brazing material in an atmosphere of vacuum. In the present invention, on the contrary thereto, the fin can be made at the same time of bonding of the aluminum plate with the ceramic board. Accordingly, a combined member having a high heat radiating ability, a high reliability and suitable to install to high power electronic parts such as power modules can be obtained with low cost.

While this invention has been described with specific embodiments thereof, it is evident that many alternatives, modifications, and variations will be apparent to those skilled in the art. Accordingly, the preferred embodiments of the invention as set forth herein are intended to be illustrative, not limiting. Various changes may be made without departing from the spirit and scope of the invention. The scope of the present invention should be defined by the terms of the claims appended hereto.

What is claimed is:

1. A combined member of aluminum-ceramics characterized by comprising a ceramic board, a circuit-receptive conductive member formed on one surface of the ceramic board, and a heat radiating member of aluminum or aluminum alloy heat-molded directly on the other surface of the ceramic board.

2. The combined member as claimed in claim 1, wherein the heat radiating member is larger in dimension than the ceramic board.

3. The combined member as claimed in claim 1, wherein the heat radiating member has a wall enclosing the ceramic board.

4. The combined member as claimed in claim 1, wherein the heat radiating member has a terminal base.

5. The combined member as claimed in claim 3, wherein the heat radiating member has a terminal base.

6. The combined member as claimed in claim 1, wherein the heat radiating member contains copper.

7. The combined member as claimed in claim 3, wherein the heat radiating member contains copper.

8. The combined member as claimed in claim 4, wherein the heat radiating member contains copper.

9. A combined member of aluminum-ceramics characterized by comprising an electrically, insulating ceramic board, a circuit-receptive conductive member, formed on one surface of the ceramic board, and a water cooling jacket of aluminum or aluminum alloy bonded directly on the other surface of the ceramic board.

10. The combined member as claimed in claim 9, wherein the water cooling jacket contains copper.

11. The combined member as claimed in claim 1, wherein the direct bonding is carried out by a molten bonding method.

12. The combined member as claimed in claim 9, wherein the direct bonding is carried out by a molten bonding method.

13. The combined member as claimed in claim 1, wherein the main component of the ceramic board is one of alumina, aluminum nitride and silicon nitride.

14. The combined member as claimed in claim 9, wherein the main component of the ceramic board is one of alumina, aluminum nitride and silicon nitride.

15. A combined member of aluminum-ceramics characterized by comprising a plurality of ceramic boards, a circuit-receptive conductive member formed on one surface of each of the ceramic boards, and a heat radiating member of aluminum or aluminum alloy heat-molded directly on the other surface of each of the ceramic boards.

16. A combined member of aluminum-ceramics characterized by comprising a plurality of electrically insulating ceramic boards, a circuit-receptive conductive member formed on one surface of each of the ceramic boards, and a water cooling jacket of aluminum or aluminum alloy bonded directly on the other surface of each of the ceramic boards.

* * * * *